United States Patent
Wallraff et al.

(10) Patent No.: US 12,311,800 B2
(45) Date of Patent: May 27, 2025

(54) SYSTEM AND METHOD FOR PERFORMANCE PREDICTION OF ELECTRIC AIRCRAFT

(71) Applicant: Rockwell Collins, Inc., Cedar Rapids, IA (US)

(72) Inventors: Robert W. Wallraff, Cedar Rapids, IA (US); Gilles Cochet, Marion, IA (US)

(73) Assignee: Rockwell Collins, Inc., Cedar Rapids, IA (US)

(*) Notice: Subject to any disclaimer, the term of this patent is extended or adjusted under 35 U.S.C. 154(b) by 128 days.

(21) Appl. No.: 18/085,838

(22) Filed: Dec. 21, 2022

(65) Prior Publication Data

US 2024/0208360 A1    Jun. 27, 2024

(51) Int. Cl.
  *B60L 58/16*    (2019.01)
  *B64D 45/00*    (2006.01)
  *G01R 31/374*   (2019.01)
  *G01R 31/3835*  (2019.01)

(52) U.S. Cl.
  CPC .......... *B60L 58/16* (2019.02); *B64D 45/00* (2013.01); *G01R 31/374* (2019.01); *G01R 31/3835* (2019.01); *B60L 2200/10* (2013.01); *B64D 2045/0085* (2013.01)

(58) Field of Classification Search
  None
  See application file for complete search history.

(56) References Cited

U.S. PATENT DOCUMENTS

| | | | |
|---|---|---|---|
| 8,972,083 B2* | 3/2015 | McCarthy | B64D 37/34 |
| | | | 701/123 |
| 10,068,489 B2 | 9/2018 | Brown et al. | |
| 10,322,824 B1* | 6/2019 | Demont | H02P 5/00 |
| 10,328,805 B1* | 6/2019 | Wyrobek | B60L 53/00 |
| 10,556,703 B1* | 2/2020 | Skola | B64D 45/00 |
| 10,589,635 B1* | 3/2020 | Solodovnik | B60L 50/13 |
| 10,592,636 B2* | 3/2020 | Ren | G07C 5/085 |
| 10,604,028 B1* | 3/2020 | Muniz | H01M 10/625 |
| 11,001,392 B1* | 5/2021 | Kern | G01G 23/002 |
| 11,142,333 B1* | 10/2021 | Richter | B64D 31/16 |
| 11,302,203 B2* | 4/2022 | Sasaki | G05D 1/248 |
| 11,302,204 B2* | 4/2022 | Hochwarth | G08G 5/0013 |
| 11,378,414 B2* | 7/2022 | Kershaw | G06F 3/04847 |
| 11,385,694 B1* | 7/2022 | Foland | H02J 7/0048 |
| 11,420,756 B1* | 8/2022 | Moy | B64D 27/31 |
| 11,482,118 B1* | 10/2022 | Nealy | B64D 45/00 |
| 11,577,848 B1* | 2/2023 | Foland | G07C 5/0825 |
| 11,827,375 B1* | 11/2023 | Henck | B64D 43/00 |

(Continued)

OTHER PUBLICATIONS

European Patent Office, Extended European Search Report received in EP Application No. 23209527.3, Jun. 5, 2024, 8 pages.

*Primary Examiner* — Jonathan M Dager
(74) *Attorney, Agent, or Firm* — Suiter Swantz IP (57) ABSTRACT

A system and for performance prediction of an electric aircraft is disclosed. The system may include a controller including one or more processors configured to execute a set of program instructions stored in a memory. The set of program instructions may be configured to cause the one or more processors to receive aircraft data, route data, and environmental data. The aircraft data may include battery data of the battery of the electric aircraft. The system may also be configured to predict an available range based on the aircraft data and the environmental data.

18 Claims, 5 Drawing Sheets

(56) References Cited

U.S. PATENT DOCUMENTS

| | | | |
|---|---|---|---|
| 11,872,869 B2* | 1/2024 | Gudapati | B60H 1/00985 |
| 12,080,177 B2* | 9/2024 | Foland | B60L 50/60 |
| 2008/0184906 A1* | 8/2008 | Kejha | B64U 50/19 |
| | | | 102/374 |
| 2011/0313652 A1 | 12/2011 | Hancock | |
| 2014/0121956 A1* | 5/2014 | Jastrzebski | B60L 58/13 |
| | | | 701/123 |
| 2014/0336921 A1* | 11/2014 | Schulte | G01C 23/005 |
| | | | 701/532 |
| 2014/0339371 A1* | 11/2014 | Yates | B64D 27/24 |
| | | | 244/53 R |
| 2016/0140853 A1* | 5/2016 | Smith | G08G 5/0013 |
| | | | 701/423 |
| 2016/0363456 A1* | 12/2016 | Pujos | G01C 21/3697 |
| 2018/0046172 A1* | 2/2018 | Tao | G05D 1/0044 |
| 2018/0061247 A1* | 3/2018 | Brown | B60L 58/12 |
| 2018/0074189 A1* | 3/2018 | Khatwa | G01W 1/10 |
| 2019/0340937 A1* | 11/2019 | Villa | G08G 5/0091 |
| 2020/0066031 A1* | 2/2020 | Neubauer | G06T 11/00 |
| 2020/0277080 A1* | 9/2020 | Wiegman | B60L 1/00 |
| 2020/0369375 A1* | 11/2020 | Leone | G01C 5/00 |
| 2021/0070457 A1* | 3/2021 | Wiegman | B64D 31/12 |
| 2021/0407303 A1* | 12/2021 | Yogesha | G05D 1/81 |
| 2022/0011782 A1* | 1/2022 | Mikic | H01M 10/625 |
| 2022/0134903 A1* | 5/2022 | Nubbe | B60L 58/16 |
| | | | 320/134 |
| 2022/0173601 A1* | 6/2022 | Lohe | H01M 50/249 |
| 2022/0176849 A1* | 6/2022 | Demont | H01M 10/482 |
| 2022/0203841 A1* | 6/2022 | Prabhu | B64D 31/16 |
| 2022/0236747 A1* | 7/2022 | Tanaka | B64U 50/19 |
| 2022/0268842 A1* | 8/2022 | Kurtz | B60L 3/0038 |
| 2022/0268850 A1* | 8/2022 | Kurtz | B60L 50/60 |
| 2022/0299569 A1* | 9/2022 | Kurtz | G01R 31/392 |
| 2022/0335841 A1* | 10/2022 | Huncha | G08G 5/0034 |
| 2023/0154337 A1* | 5/2023 | Foland | G08G 5/0013 |
| 2023/0331395 A1* | 10/2023 | Ciabrini | G01C 23/005 |
| 2023/0382555 A1* | 11/2023 | Henck | B64D 45/00 |
| 2024/0051679 A1* | 2/2024 | Bosson | B64D 45/00 |
| 2024/0054903 A1* | 2/2024 | Mollahan | B64C 29/0008 |
| 2024/0118099 A1* | 4/2024 | Weld | B60L 58/13 |

* cited by examiner

| CID001 — | Alt | 8548 |

| DTG(NM) | Energy (kWh) | Wind | OAT(°C) |
|---|---|---|---|
| 130 | 8770- 20 | 276T/ 2 | -9 |

404

✦ KAYQU — ↓ Alt 7000
ETA 20:43  -13
Spd 210     (IA)
VPA 3.00°

| DTG(NM) | Energy (kWh) | Wind | OAT(°C) |
|---|---|---|---|
| 78.9 | 8250+ 530 | 200T/ 20 | +6 |

181°  6.6 NM  ETE 0:00  RNP 1.00

406

✦ SHUUT — ↓ Alt 5000
ETA 20:43  -13
Spd 210
VPA 4.45°

| DTG(NM) | Energy (kWh) | Wind | OAT(°C) |
|---|---|---|---|
| 85.4 | 8250+ 530 | 200T/ 20 | +6 |

408

| | | | DTG | ETA(Z) | TTG | Energy (kWh) | |
|---|---|---|---|---|---|---|---|
| ◯ | Orig | KCID | | | | | |
| ◯ | Dest | KMSP | 102 | 20:49-13 | 0:18 | 8130+530 | ▮ |
| ◯ | Altn | KPSP | 1386 | 01:19+42 | 4:48 | 190+1110 | ▯ |

| From | N41°53.60  W091°53.84 | Alt   8548  FT |
| CID001 | Wind    360T/    0 KT | Temp - 9°C |
|  | Energy  8770     -    20 |  |

412

| To | N41°10.80  W093°29.16 | CRS  841° |
| KAYQU |  | DTG  72.9 NM |
|  | Energy  8240    +   520 | ETA  20:43 Z - 14 |
|  |  | ETE     0:12 |

414

| Next | N45°04.24  W093°29.32 | CRS  181° |
| SHUUT | Dist       6.6NM | DTG  79.5 NM |
|  | Energy  8240    +   520 | ETA  20:42 Z - 14 |
|  |  | ETE     0:00 |

416

Weather

Mid Pt N4153W091    Wind 360T/    0KT    Temp - 6°C

Dest  KMSP
Dest TTG  0:18    Dest DTG  95.6 NM    Energy Rmng  8420 kWh
Flt Time  0:08    Flt Dist  46.5 NM    Energy Used   640 kWh

SYSTEM AND METHOD FOR PERFORMANCE PREDICTION OF ELECTRIC AIRCRAFT

TECHNICAL FIELD

The present disclosure relates to the field of aviation, and more particularly to a system and method for performance prediction of electric aircraft.

BACKGROUND

Electric aircraft are becoming increasingly popular due to their potential for reduced emissions and improved efficiency. However, they require accurate performance computations in order to ensure the remaining battery energy (e.g., remaining capacity) is sufficient to reach the destination safely. Many factors affect the battery capability and must be taken into account when predicting flying range and reserves.

Currently there is no system that can accurately predict available range of an electric aircraft taking all these factors into consideration. This lack of a reliable solution means that operators cannot be assured that their flights will have enough power reserves for safe operation. Therefore, there exists a need for an efficient method or system which can accurately predict available range of electric aircraft.

SUMMARY

A system for performance prediction of an electric aircraft is disclosed in accordance with one or more illustrative embodiments of the present disclosure. In one illustrative embodiment, the system may include a controller including one or more processors configured to execute a set of program instructions stored in a memory. In another illustrative embodiment, the set of program instructions may be configured to cause the one or more processors to receive aircraft data, route data, and environmental data. In another illustrative embodiment, the aircraft data may include battery data of the battery of the electric aircraft. In another illustrative embodiment, the system may be configured to predict an available range based on the aircraft data and the environmental data.

A method for performance prediction of an electric aircraft is disclosed in accordance with one or more illustrative embodiments of the present disclosure. In one illustrative embodiment, the method may include receiving aircraft data, route data, and environmental data. In another illustrative embodiment, the aircraft data may include battery data of the battery of the electric aircraft. In another illustrative embodiment, the method may include predicting an available range based on the aircraft data and the environmental data.

In another illustrative embodiment, the battery data may include historical battery performance data.

In another illustrative embodiment, the predicting the available range may include determining an initial battery capacity estimate, where the initial battery capacity estimate is based on a voltage of the battery and a temperature of the battery.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

Broadly speaking, the present disclosure is directed to a system for performance prediction of electric aircraft. The system is configured to receive aircraft data, route data, and environmental data. The aircraft data includes battery data of the battery of the electric aircraft. The system is configured to predict an available range based on the aircraft data and the environmental data. Memory may be configured to store the aircraft data, route data, and environmental data. Embodiments of this disclosure allow crews of future electric aircraft to plan their flights more effectively and ensure that the battery energy is sufficient to reach their destination safely.

Figure 1:
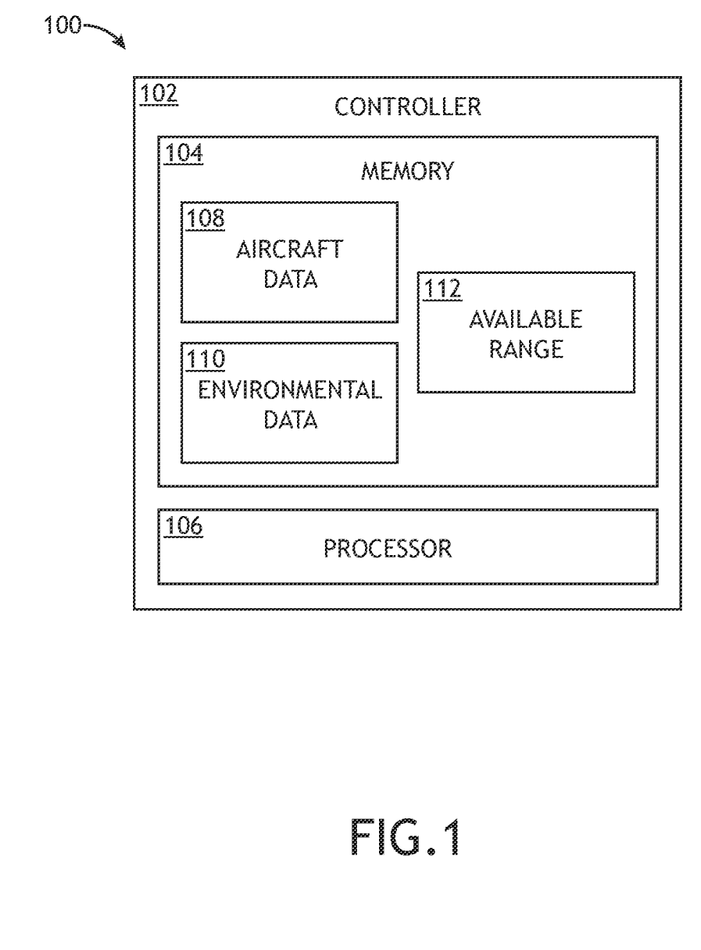
FIG. 1 is a conceptual diagram of the system for performance prediction of electric aircraft, according to an embodiment of the present invention.

Referring to FIG. 1, a conceptual diagram of the system 100 for performance prediction of an electric aircraft is shown, according to one or more embodiments of the present disclosure. The system 100 includes a controller 102 configured to execute a set of program instructions stored in a memory 104 and executed on a processor 106. The controller 102 may be communicatively coupled to a network (not shown) to receive data (e.g., aircraft data 108) but the network isn't a part of the system 100, unless otherwise noted. The network and/or memory 104 may be used to store the data.

Figure 2:
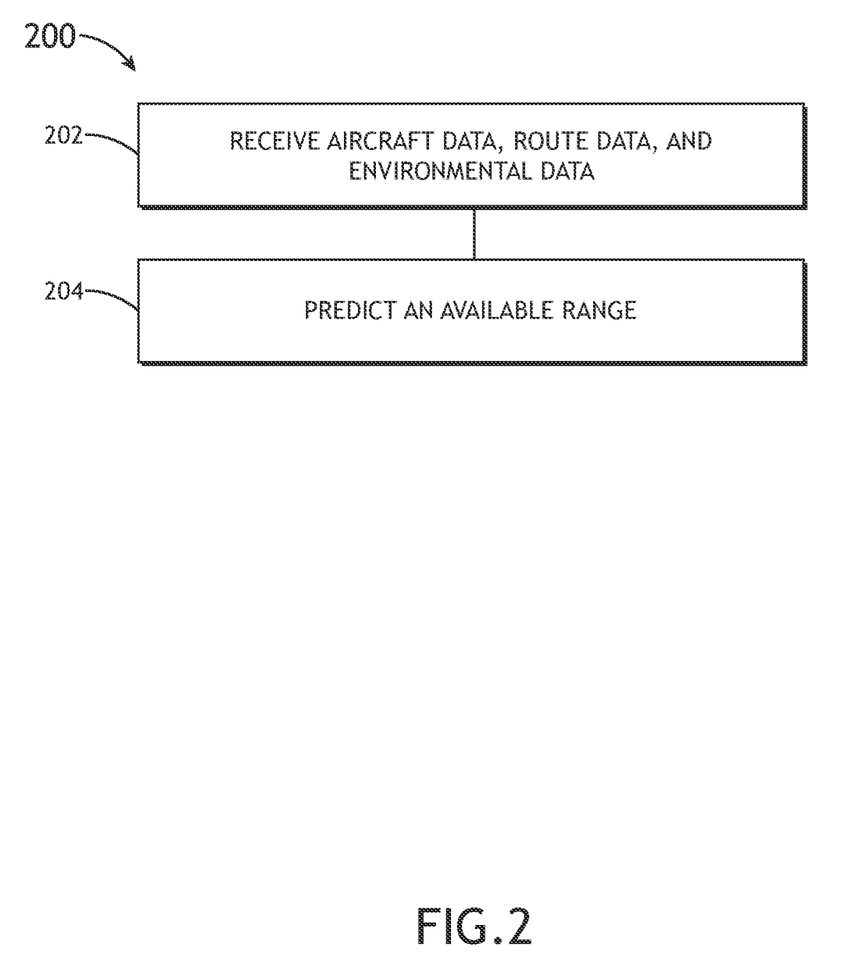
FIG. 2 is a process flow diagram illustrating the method for performance prediction of electric aircraft, according to an embodiment of the present invention.

Referring to FIG. 2, a process flow diagram illustrating the method 200 for performance prediction of an electric aircraft is shown, according to one or more embodiments of the present disclosure.

At step 202, aircraft data 108, route data, and environmental data 110 are received. For example, the controller 102 may receive aircraft data 108, route data, and environmental data 110 to be stored on memory 104.

In embodiments, the aircraft data 108 may include weight and basic airframe performance data. The weight data may include the weight of the aircraft, the weight of the payload, and/or the like. The basic airframe performance data may include the drag coefficient of the aircraft, the lift coefficient of the aircraft, and/or the like. This data may be used to predict the available range 112.

At step 204, the available range 112 is predicted based on the aircraft data 108 and the environmental data 110.

Figure 3:
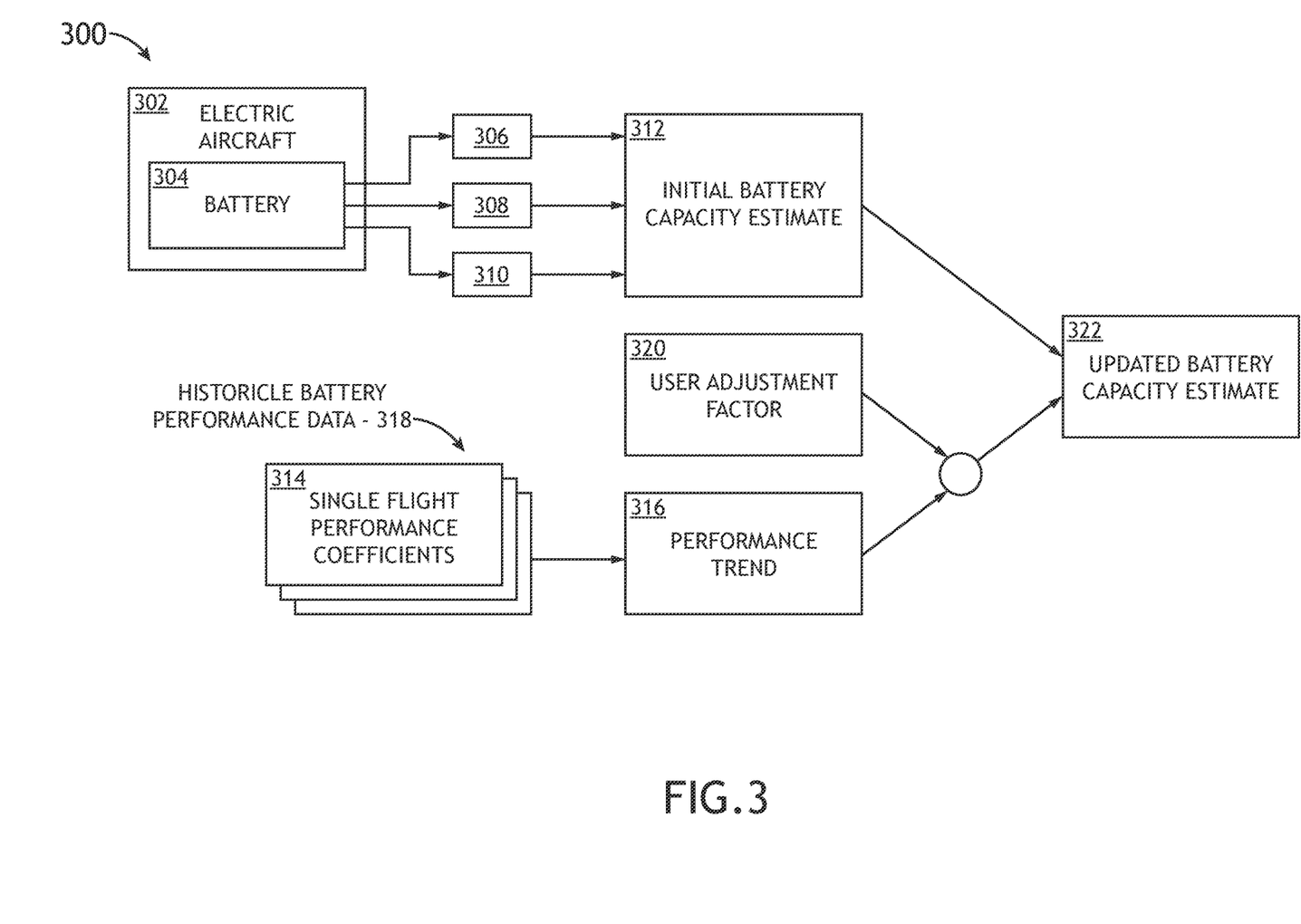
FIG. 3 is a data flow diagram illustrating determining an updated battery capacity estimate, according to an embodiment of the present invention.

Referring to FIG. 3, a data flow diagram 300 illustrating determining an updated battery capacity estimate 322 is shown, according to one or more embodiments of the present disclosure. Although not necessarily a part of the system 100, generally, an electric aircraft 302 (e.g., aircraft with flight powered by batteries and electric motors) includes a battery 304. The battery 304 may include sensors (not shown) inside the battery configured to transmit battery data such a voltage 306, a temperature 308, other battery data 310 (e.g., last battery charge data such as kWh charged and/or length of time charged), and historical battery performance data (e.g., discharge and charge cycle data such as voltage, time, amperage, and/or the like configured to be used to determine battery energy used versus battery charging efficiency). Note that battery charging efficiency may be known per battery specifications (e.g., provided by an OEM).

The aircraft data 108 may include battery data of the battery 304 of the electric aircraft 302. The controller 102 may be further configured to predict an available range 112 based on the aircraft data 108 and the environmental data 110. The memory 104 may be configured to store the aircraft data 108, route data, and environmental data 110. In embodiments, the aircraft data 108 includes battery data of the battery 304 of the electric aircraft 302 such as historical battery performance data 318.

In embodiments, the controller 102 may determine an initial battery capacity estimate 312 based on the voltage 306 and the temperature 308 of the battery 304. This estimate is typically accurate, but may not be the most precise. To improve accuracy, the controller 102 may also determine an updated battery capacity estimate 322 based on the initial battery capacity estimate 312 and historical battery performance data 318.

Data such as wind speed and temperature data is available from weather monitoring and prediction services, and may be received by the controller 102 to be used in the performance prediction calculations. This data may be received by the controller (e.g., linked to a controller 102 of the aircraft) at an airport gate or on an airport ramp, using a wireless communication protocol such as Wi-Fi or other terrestrial communication link. Updates to this data in-flight may be performed using existing satellite or datalink communication methods. The electric aircraft 302 may also measure its own environmental data 110 (e.g., wind/temp) along the route, and factor that into the calculations. This data may be received from aircraft sensors and/or used to update the available range 112.

In embodiments, the controller 102 may determine a performance trend 316 based on the historical battery performance data 318 and use the performance trend 316 to predict a future performance of the battery (e.g., an updated battery capacity estimate 322 for an upcoming flight). For example, the performance trend 316 may be based on single flight performance coefficients 314.

In embodiments, the controller 102 may determine single flight performance coefficients 314 for each flight based on the historical battery performance data 318. The single flight performance coefficients (Coefficient) 314 may be based on, for example, the following equation:

$$\text{Coefficient} = 1 - ((\text{Energy}_{adjusted} - \text{Energy}_{used}) / \text{Energy}_{adjusted})$$

where $\text{Energy}_{adjusted}$ is actual energy used to recharge the battery 304 times the recharge efficiency, and $\text{Energy}_{used}$ is the actual energy used during flight. For example, energy (e.g., kWh) may be voltage times current and may also include time. Recharge efficiency may be a measure of the energy used in recharging the battery 304 versus the energy actually stored in the battery from such a recharging. The value may be between 0 and 1 and provided by the battery supplier or some other method for determining such a value known in the art.

Note that, in some embodiments, the available range 112 may be based on a battery capacity such as the initial battery capacity estimate 312 and/or the updated battery capacity estimate 322. In this regard, similar to how combustion engine aircraft display remaining fuel in pounds or kilograms, the available range 112 may be displayed in battery capacity units such as kWh or the like. In other embodiments, the available range 112 is, or includes, a distance range, such as may indicate a remaining distance that may be traveled in miles or kilometers. A distance range may be calculated, for example, based on a battery capacity (e.g., updated battery capacity estimate 322) or estimated remaining battery capacity mid-flight (i.e., remaining energy) and other data such as the aircraft data, the route data, and/or the environmental data.

In embodiments, the controller 102 may receive a user adjustment factor 320 that can be used to adjust the available range 112 and/or the initial battery capacity estimate 312. This adjustment factor can be used to customize the available range based on a user's preferences. The user can adjust the user adjustment factor to increase or decrease the available range (or a remaining portion of the available range) by a certain percentage (e.g., 5%, 10%, and/or the like). In this way, a user may use the user adjustment factor 320 to account for variables outside of the system's normal input parameters, or simply for added safety or confidence in reserved energy.

Figure 4A:
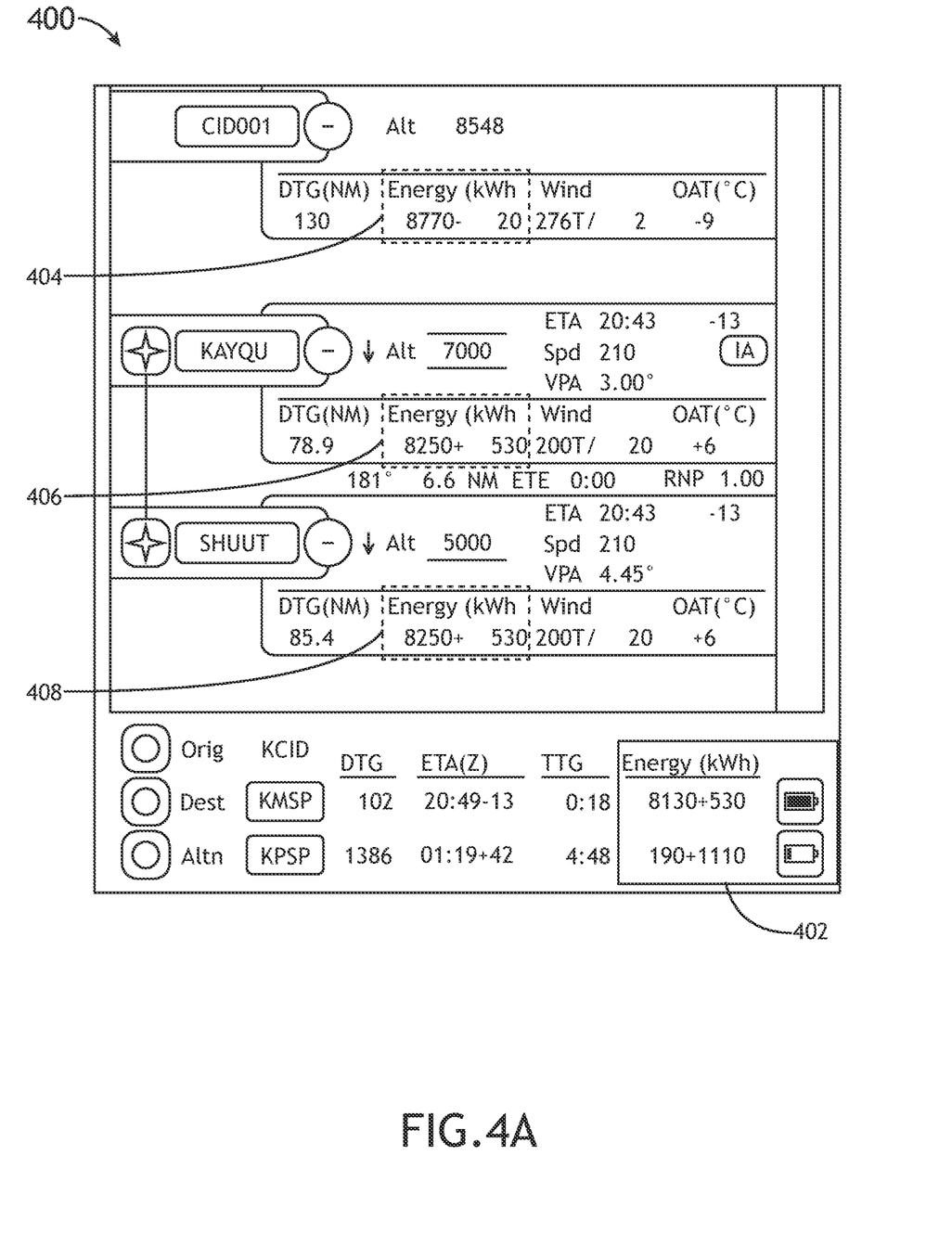
FIG. 4A is a display that is displaying a predicted performance of the battery, according to an embodiment of the present invention.

Referring to FIG. 4A, a display 400 that is displaying a predicted performance of the battery is shown, according to one or more embodiments of the present disclosure.

The display 400 may include a (currently predicted) remaining energy at the destination or alternate destination 402. For instance, "8130" may indicate that 8130 kWh is predicted to remain after reaching a destination, which may be "+530" KW higher than originally predicted before the flight started. As the flight goes on, the real-world conditions (e.g., wind speeds, temperatures, etc.) may differ from predicted conditions, causing changes in the originally predicted remaining energy of the battery 304.

Note that "190" may indicate a (predicted) remaining energy available at an alternate destination. An alternate destination may need to be used if the destination is not available (e.g., can't be landed at). The "1110" is the difference in what was originally predicted to reach the alternate destination. The display 400 may be configured to display a caution message if the remaining energy at a destination and/or alternate destination 402 drops below a predetermined threshold. For instance, the caution message may include colored text and/or graphics, and/or the text may say "Check Energy at Dest", "Check Energy at Alt", or the like. By way of another example, these remaining energy numbers may appear in yellow such as if the "190" number is lower than the predetermined threshold (e.g., 'minimum energy quantity') defined in a flight management system (FMS) as a default value.

The display 400 may include a (previously measured) remaining energy 404 when sequencing the last waypoint (e.g., the FROM waypoint). Further, "−20" indicates that 20 kWh more energy remained at this waypoint than originally predicted before takeoff.

The display 400 may include a (currently predicted) remaining energy 406 when sequencing the next waypoint (e.g., the TO waypoint, the KAYOU waypoint). For instance, the number "8250" may be the predicted remaining energy when sequencing the TO waypoint, and "+530" may be the difference in energy between "8250" and the originally predicted remaining energy when sequencing the TO waypoint. For example, additional energy may mean the conditions (e.g., lower headwinds) and/or battery performance to reach the TO waypoint are going better than expected, and additional remaining energy is anticipated compared to the original prediction.

Similarly, the display 400 may show the remaining energy 408 when sequencing another (e.g., third) waypoint, similar to the remaining energy 406 shown for the next waypoint.

Figure 4B:
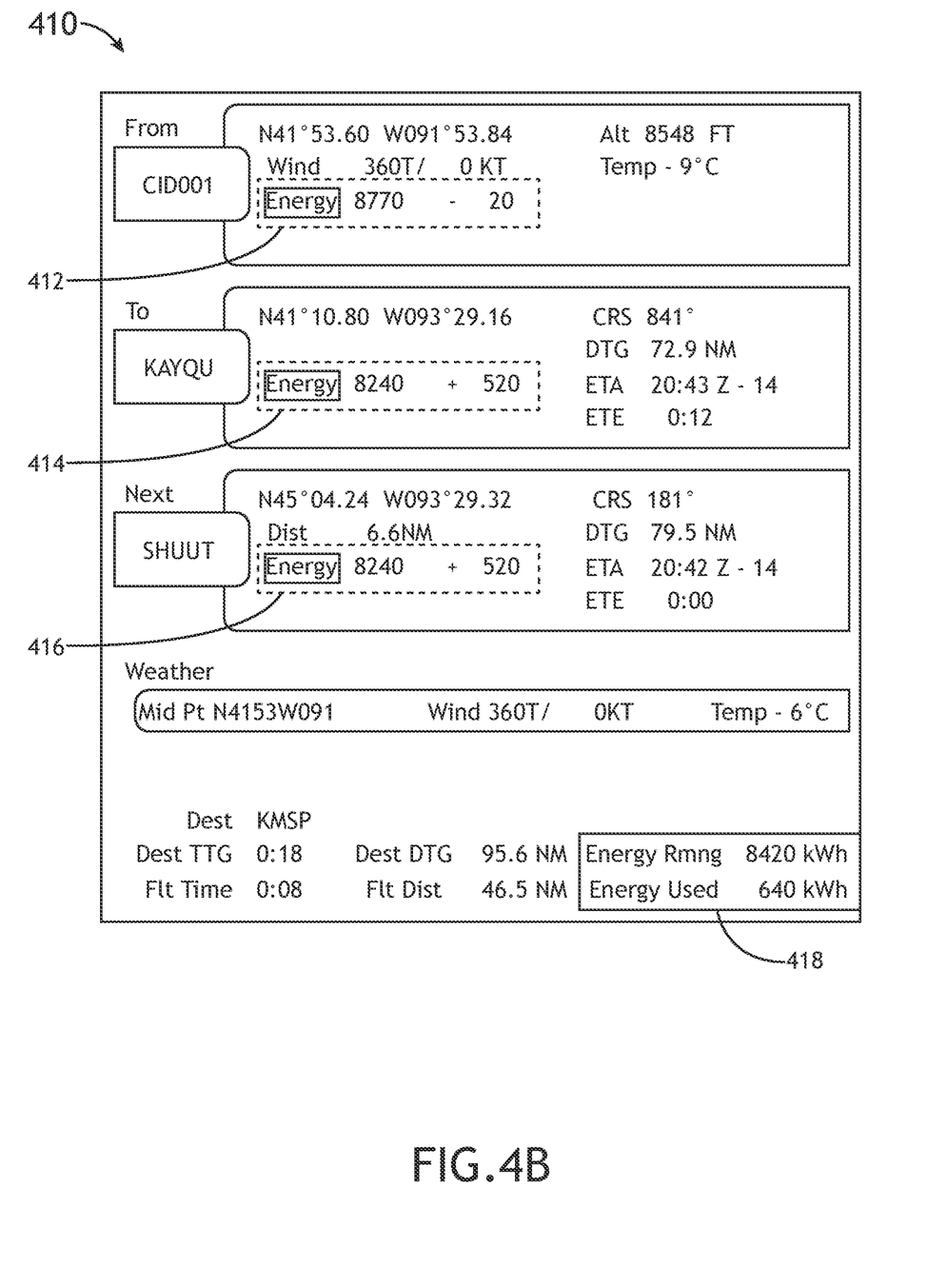
FIG. 4B is a display that is displaying a predicted performance including a remaining energy at the destination, according to an embodiment of the present invention.

Referring to FIG. 4B, a display 410 that is displaying a (currently predicted) remaining energy is shown. For example, the remaining energy ("8420 kWh") and energy used so far ("640") are shown in block 418 of FIG. 4B.

FIG. 4B may be FIG. 4A, but at a different time of the flight, with updated values. Remaining energy 412 (at the FROM checkpoint) may be the same as remaining energy 412 because nothing has changed regarding the FROM checkpoint previously sequenced; remaining energy 414 (at the TO checkpoint) may be remaining energy 406; and remaining energy 416 (at the checkpoint thereafter) may be remaining energy 408.

In embodiments, the available range 112 calculated at an earlier time may be used to calculate at least some of the values shown in FIGS. 4A and 4B.

In another embodiment, the (currently predicted) available energy (e.g., 8420 kWh) may be determined using the same or similar methods described herein for calculating the available range 112 but adjusting for factors such as, but not limited to, battery energy already used, and updated information such as new predictions for wind speed, temperature, altitude, remaining distance to destination, updated waypoints, and/or the like.

Because of the large amount of data needed to make these computations accurately, it may be critical that as much of the data entry and caution messages as possible are automated to relieve the crew of data entry tasks.

In embodiments, the route data may include origin airport location, destination airport location, selected runways, flight plan, and cruising altitude. The environmental data may include temperatures along the route, wind speeds along the route, predicted temperatures along the route, and predicted wind speeds along the route.

Embodiments of this disclosure may allow crews of future electric aircraft to better plan their flights, and provide more assurance that the battery energy is sufficient to get them to their destination safely.

Components (e.g., controller 102) are described in additional detail below, in accordance with one or more embodiments.

The one or more processors 106 of controller 102 may include any one or more processing elements known in the art. In this sense, the one or more processors 106 may include any microprocessor device configured to execute algorithms and/or instructions. In one embodiment, the one or more processors 106 may consist of a desktop computer, mainframe computer system, workstation, image computer, parallel processor, or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. In general, the term "processor" may be broadly defined to encompass any device having one or more processing elements, which execute program instructions from a non-transitory memory medium (e.g., memory 104). Moreover, different subsystems of the system 100 may include processor or logic elements suitable for carrying out at least a portion of the steps described throughout the present disclosure. Therefore, the above description should not be interpreted as a limitation on the present invention but merely an illustration.

The memory medium 104 may include any storage medium known in the art suitable for storing program instructions executable by the associated one or more processors 106. For example, the memory medium 104 may include a non-transitory memory medium. For instance, the memory medium 104 may include, but is not limited to, a read-only memory, a random access memory, a magnetic or optical memory device (e.g., disk), a magnetic tape, a solid state drive and the like. In another embodiment, it is noted herein that the memory 104 is configured to store one or more results from the system 100 and/or the output of the various steps described herein. It is further noted that memory 104 may be housed in a common controller housing with the one or more processors 106. In an alternative embodiment, the memory 104 may be located remotely with respect to the physical location of the processors and controller 102. For instance, the one or more processors 106 of controller 102 may access a remote memory (e.g., server), accessible through a network (e.g., internet, intranet and the like). In another embodiment, the memory medium 104 stores the program instructions for causing the one or more processors 106 to carry out the various steps described through the present disclosure.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently,"

temporarily, or for some period of time. For example, the storage medium may be random access memory (RAM), and the results may not necessarily persist indefinitely in the storage medium.

In another embodiment, the controller 102 of the system 100 may be configured to receive and/or acquire data or information from other systems by a transmission medium that may include wireline and/or wireless portions. In another embodiment, the controller 102 of the system 100 may be configured to transmit data or information (e.g., the output of one or more processes disclosed herein) to one or more systems or subsystems by a transmission medium that may include wireline and/or wireless portions. In this manner, the transmission medium may serve as a data link between the controller 102 and other subsystems of the system 100. Moreover, the controller 102 may send data to external systems via a transmission medium (e.g., network connection).

In another embodiment, the system 100 includes a user interface. In one embodiment, the user interface is communicatively coupled to the one or more processors 106 of controller 102. In another embodiment, the user interface device may be utilized by controller 102 to accept selections and/or instructions from a user. In some embodiments, described further herein, a display may be used to display data to a user (not shown). In turn, a user may input, via user input device, a selection and/or instructions responsive to data displayed to the user via the display device.

The user interface device may include any user interface known in the art. For example, the user input device of the user interface may include, but is not limited to, a keyboard, a keypad, a touchscreen, a lever, a knob, a scroll wheel, a track ball, a switch, a dial, a sliding bar, a scroll bar, a slide, a handle, a touch pad, a paddle, a steering wheel, a joystick, a bezel input device or the like. In the case of a touchscreen interface device, those skilled in the art should recognize that a large number of touchscreen interface devices may be suitable for implementation in the present invention. For instance, the display device may be integrated with a touchscreen interface, such as, but not limited to, a capacitive touchscreen, a resistive touchscreen, a surface acoustic based touchscreen, an infrared based touchscreen, or the like. In a general sense, any touchscreen interface capable of integration with the display portion of a display device is suitable for implementation in the present invention. In another embodiment, the user input device may include, but is not limited to, a bezel mounted interface.

The display device may include any display device known in the art. In one embodiment, the display device may include, but is not limited to, a liquid crystal display (LCD). In another embodiment, the display device may include, but is not limited to, an organic light-emitting diode (OLED) based display. In another embodiment, the display device may include, but is not limited to a CRT display. Those skilled in the art should recognize that a variety of display devices may be suitable for implementation in the present invention and the particular choice of display device may depend on a variety of factors, including, but not limited to, form factor, cost, and the like. In a general sense, any display device capable of integration with a user input device (e.g., touchscreen, bezel mounted interface, keyboard, mouse, trackpad, and the like) is suitable for implementation in the present invention.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed:

1. A system for performance prediction of an electric aircraft, the system comprising:
   a controller including one or more processors configured to execute a set of program instructions stored in a memory, the set of program instructions configured to cause the one or more processors to:
   receive aircraft data, route data, and environmental data, wherein the aircraft data includes battery data of a battery of the electric aircraft;
   predict an available range based on the aircraft data and the environmental data; and
   display, after the predicting of the available range and during a flight, a difference in predicted performance of the battery based on an updated available range configured to be predicted during the flight and the available range previously predicted.

2. The system of claim 1, wherein the battery data comprises historical battery performance data.

3. The system of claim 2, wherein the predicting the available range comprises determining an initial battery capacity estimate, wherein the initial battery capacity estimate is based on a voltage of the battery and a temperature of the battery.

4. The system of claim 3, wherein the predicting the available range comprises determining an updated battery capacity estimate, wherein the updated battery capacity estimate is based on the initial battery capacity estimate and the historical battery performance data.

5. The system of claim 2, wherein the predicting the available range comprises determining a performance trend based on the historical battery performance data and using the performance trend to predict a future performance of the battery.

6. The system of claim 1, wherein the set of program instructions are further configured to cause the one or more processors to:
 display a caution message on a display if a difference between a currently predicted remaining energy at a destination drops below a predetermined threshold.

7. The system of claim 1, where the system is configured to receive a user adjustment factor configured to be used to adjust the predicted available range.

8. The system of claim 1, wherein the route data comprises origin airport location, destination airport location, selected runways, flight plan, and cruising altitude.

9. The system of claim 1, wherein the environmental data comprises temperatures along the route, wind speeds along the route, predicted temperatures along the route, and predicted wind speeds along the route.

10. A method for performance prediction of an electric aircraft, the method comprising:
 receiving aircraft data, route data, and environmental data, wherein the aircraft data includes battery data of a battery of the electric aircraft;
 predicting an available range based on the aircraft data and the environmental data, and
 displaying, after the predicting of the available range and during a flight, a difference in predicted performance of the battery based on an updated available range configured to be predicted during the flight and the available range previously predicted.

11. The method of claim 10, wherein the battery data comprises historical battery performance data.

12. The method of claim 11, wherein the predicting the available range comprises determining an initial battery capacity estimate, wherein the initial battery capacity estimate is based on a voltage of the battery and a temperature of the battery.

13. The method of claim 12, wherein the predicting the available range comprises determining an updated battery capacity estimate, wherein the updated battery capacity estimate is based on the initial battery capacity estimate and the historical battery performance data.

14. The method of claim 11, wherein the predicting the available range comprises determining a performance trend based on the historical battery performance data and using the performance trend to predict a future performance of the battery.

15. The method of claim 10 further comprising:
 displaying a caution message on a display if a difference between a currently predicted remaining energy at a destination drops below a predetermined threshold.

16. The method of claim 10 receiving a user adjustment factor configured to be used to adjust the predicted available range.

17. The method of claim 10, wherein the route data comprises origin airport location, destination airport location, selected runways, flight plan, and cruising altitude.

18. The method of claim 10, wherein the environmental data comprises temperatures along the route, wind speeds along the route, predicted temperatures along the route, and predicted wind speeds along the route.

* * * * *